(12) United States Patent
Ahn (10) Patent No.: US 12,274,001 B2
(45) Date of Patent: Apr. 8, 2025

(54) PRINTED CIRCUIT BOARD

(71) Applicant: SAMSUNG ELECTRO-MECHANICS CO., LTD., Suwon-si (KR)

(72) Inventor: Sang Min Ahn, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 198 days.

(21) Appl. No.: 18/097,661

(22) Filed: Jan. 17, 2023

(65) Prior Publication Data

US 2024/0040698 A1 Feb. 1, 2024

(30) Foreign Application Priority Data

Jul. 27, 2022 (KR) .................. 10-2022-0093166

(51) Int. Cl.
*H05K 1/11* (2006.01)
*H05K 3/40* (2006.01)
*H05K 3/46* (2006.01)

(52) U.S. Cl.
CPC .......... *H05K 1/115* (2013.01); *H05K 3/4007* (2013.01); *H05K 3/4647* (2013.01); *H05K 2201/0367* (2013.01); *H05K 2201/09563* (2013.01); *H05K 2201/096* (2013.01); *H05K 2201/10674* (2013.01)

(58) Field of Classification Search
CPC ..... H05K 1/115; H05K 3/4007; H05K 3/4647
See application file for complete search history.

(56) References Cited

U.S. PATENT DOCUMENTS

2022/0141953 A1* 5/2022 Jeon .................. H05K 1/0373
174/251

FOREIGN PATENT DOCUMENTS

JP 2017-069504 A 4/2017
JP 2021-097154 A 6/2021

* cited by examiner

*Primary Examiner* — Jeremy C Norris
(74) *Attorney, Agent, or Firm* — Morgan, Lewis & Bockius LLP (57) ABSTRACT

A printed circuit board includes a substrate including a plurality of wiring layers; a first metal post disposed on the substrate and connected to at least a portion of an uppermost wiring layer among the plurality of wiring layers; a second metal post disposed on the substrate and connected to at least another portion of the uppermost wiring layer among the plurality of wiring layers; a resist layer disposed on the substrate and embedding at least a portion of each of the first and second metal posts; and a metal via penetrating through the resist layer on the second metal post and connected to the second metal post.

27 Claims, 8 Drawing Sheets

PRINTED CIRCUIT BOARD

CROSS-REFERENCE TO RELATED APPLICATIONS

This application claims benefit of priority to Korean Patent Application No. 10-2022-0093166 filed on Jul. 27, 2022 in the Korean Intellectual Property Office, the disclosure of which is incorporated herein by reference in its entirety.

TECHNICAL FIELD

The present disclosure relates to a printed circuit board on which an electronic component such as a semiconductor chip may be mounted.

BACKGROUND

Recently, with the advancement of printed circuit boards, a via size of printed circuit boards has been reduced. Accordingly, related techniques such as post formation has also increased, and accordingly, much attention has been drawn to improving a signal transmission rate. Also, as the number of mounted semiconductor chips has increased, interest in heat generation has also increased.

SUMMARY

An aspect of the present disclosure is to provide a printed circuit board which may have excellent signal transmission properties and an excellent heat dissipation effect.

An aspect of the present disclosure is to form a second metal post for a dummy together with a first metal post for signal connection on an outermost side of a substrate, to embed at least a portion of each of the first and second metal posts using a resist layer, and to form a metal via penetrating through the resist layer and connected to the second metal post on the second metal post.

For example, according to an aspect of the present disclosure, a printed circuit board includes a substrate including a plurality of wiring layers; a first metal post disposed on the substrate and connected to at least a portion of an uppermost wiring layer among the plurality of wiring layers; a second metal post disposed on the substrate and connected to at least another portion of the uppermost wiring layer among the plurality of wiring layers; a resist layer disposed on the substrate and embedding at least a portion of each of the first and second metal posts; and a metal via penetrating through the resist layer on the second metal post and connected to the second metal post.

For example, according to an aspect of the present disclosure, a printed circuit board includes a substrate including a plurality of wiring layers; a first metal post disposed on the substrate and connected to at least a portion of an uppermost wiring layer among the plurality of wiring layers; a second metal post disposed on the substrate and connected to at least another portion of the uppermost wiring layer among the plurality of wiring layers; and a resist layer having a first region embedding at least a portion of the first metal post and a second region embedding at least a portion of the second metal post. The first region is disposed in a central portion of the resist layer on a plane. The second region is disposed on an outer portion of the resist layer on the plane. The resist layer has different thicknesses in the first and second regions.

For example, according to an aspect of the present disclosure, a printed circuit board includes a substrate including a plurality of wiring layers; a first metal post disposed on the substrate and connected to at least a portion of an uppermost wiring layer among the plurality of wiring layers; a second metal post disposed on the substrate and connected to at least another portion of the uppermost wiring layer among the plurality of wiring layers; and a resist layer disposed on the substrate, and including a first layer embedding at least a portion of each of the first and second metal posts and a second layer disposed on the first layer to cover another portion of the second metal post which protrudes from the first layer. The second layer is spaced apart from the first metal post.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
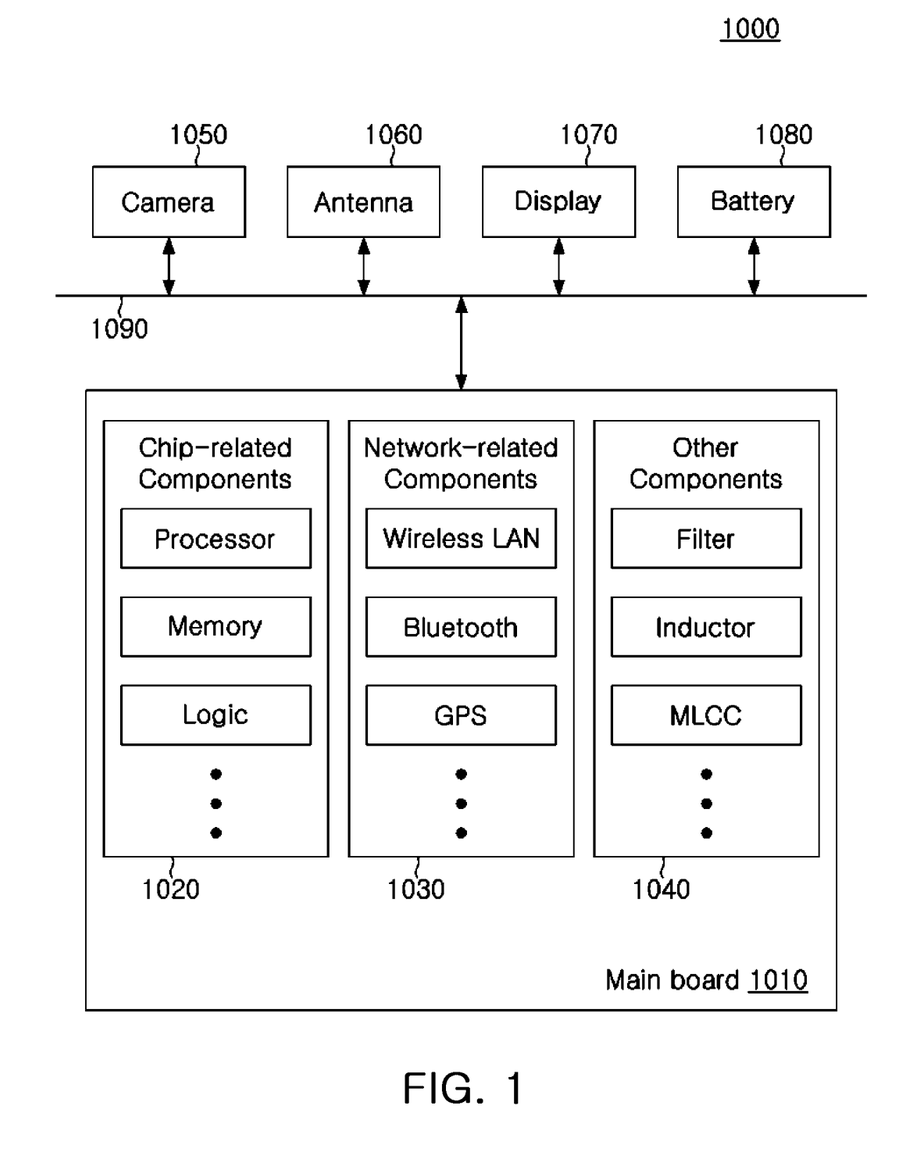
FIG. 1 is a block diagram illustrating an example embodiment of an electronic device system.

FIG. 1 is a block diagram illustrating an example embodiment of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. Also, other components 1040 may be combined with each other, together with the chip related components 1020 and/or the network related components 1030 described above.

Depending on a type of the electronic device 1000, the electronic device 1000 may include other components that may or may not be physically or electrically connected to the mainboard 1010. The other components may include, for example, a camera module 1050, an antenna module 1060, a display 1070, and a battery 1080. However, the other components are not limited thereto, and may include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. The other components may also include other components used for various purposes depending on a type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
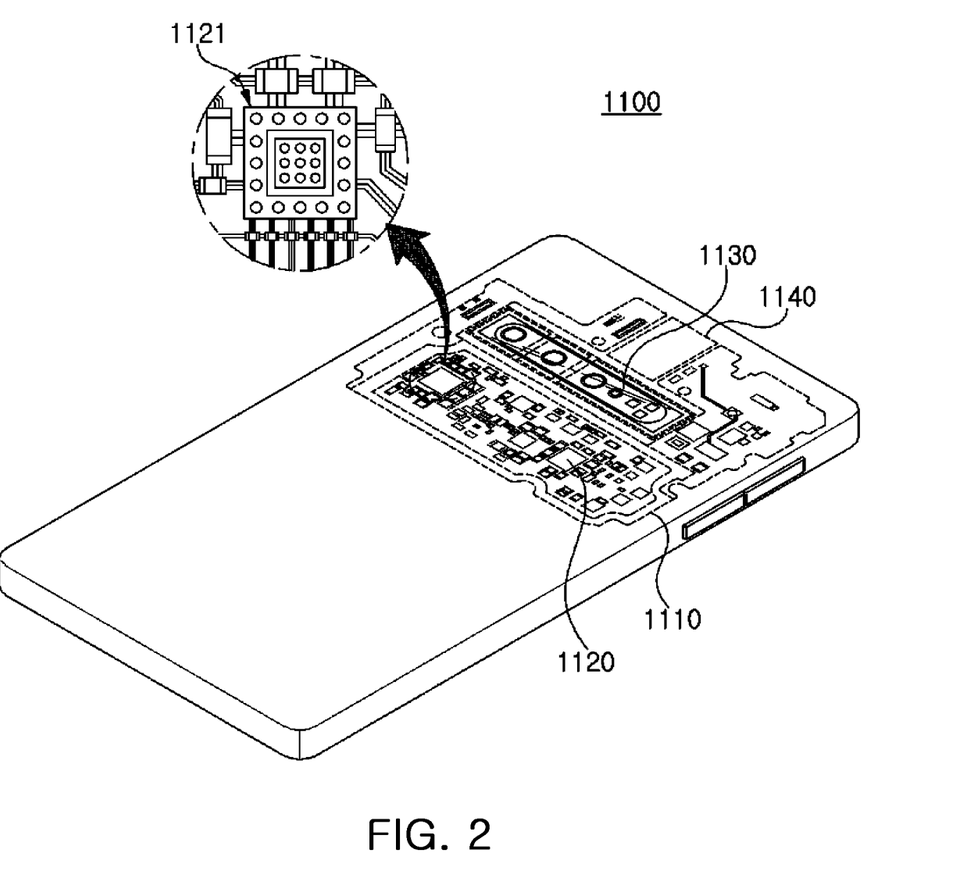
FIG. 2 is a perspective diagram illustrating an example embodiment of an electronic device.

FIG. 2 is a perspective diagram illustrating an example embodiment of an electronic device.

Referring to FIG. 2, an electronic device may be a smartphone 1100. A motherboard 1110 may be accommodated in the smartphone 1100, and various components 1120 may be physically or electrically connected to the motherboard 1110. Also, other components that may or may not be physically or electrically connected to the motherboard 1110, such as a camera module 1130 and/or the speaker 1140, may be accommodated in a body of the electronic device. A portion of the components 1120 may be the chip related components, such as, for example, a component package 1121, but an example embodiment thereof is not limited thereto. The component package 1121 may have the form of a printed circuit board on which electronic components including active components and/or passive components are surface-mounted. Alternatively, the component package 1121 may be configured in the form of a printed circuit board in which active components and/or passive components are embedded. The electronic device is not necessarily limited to the smartphone 1100, and may be other electronic devices as described above.

Printed Circuit Board

Figure 3:
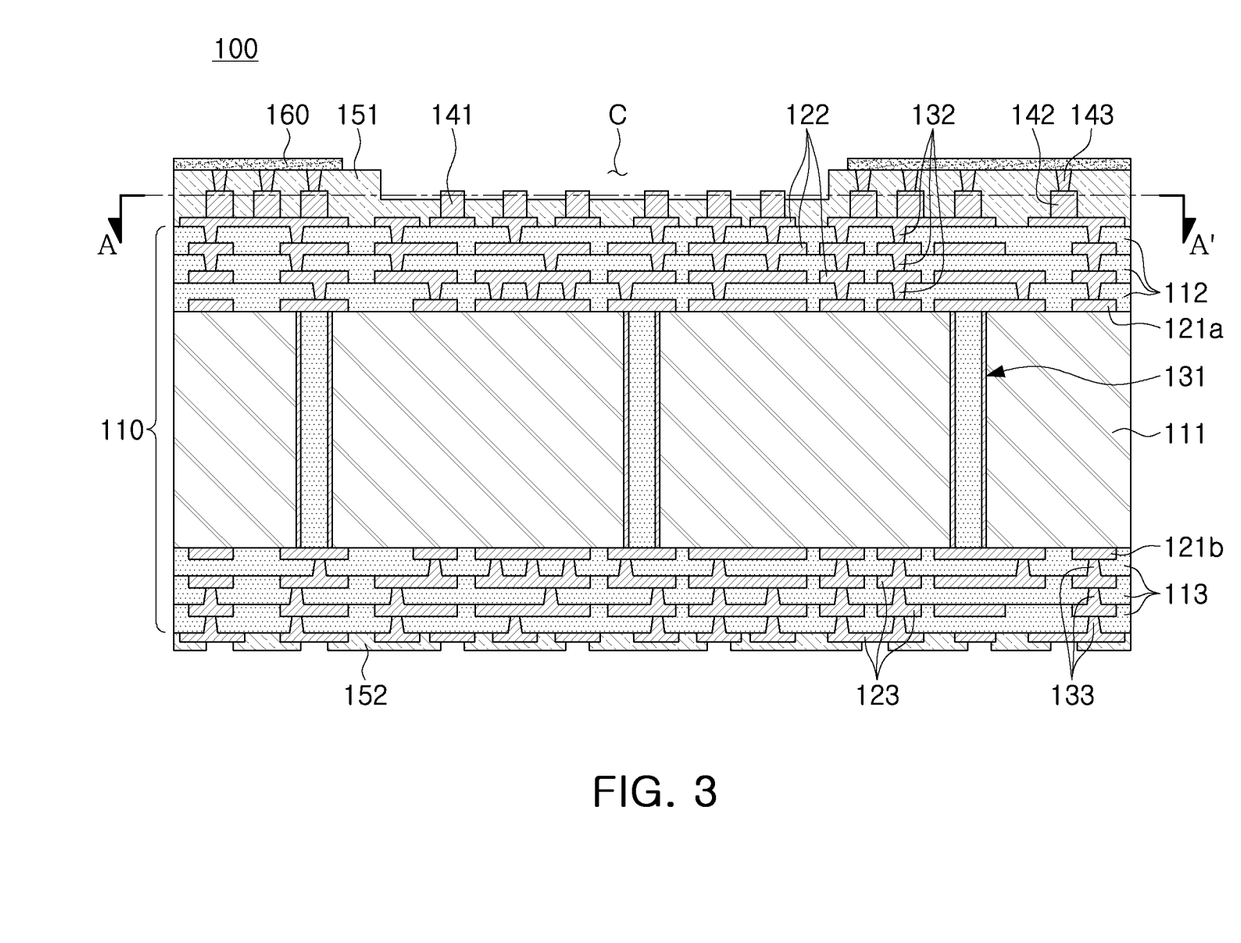
FIG. 3 is a cross-sectional diagram illustrating an example embodiment of a printed circuit board.

FIG. 3 is a cross-sectional diagram illustrating an example embodiment of a printed circuit board.

Figure 4:
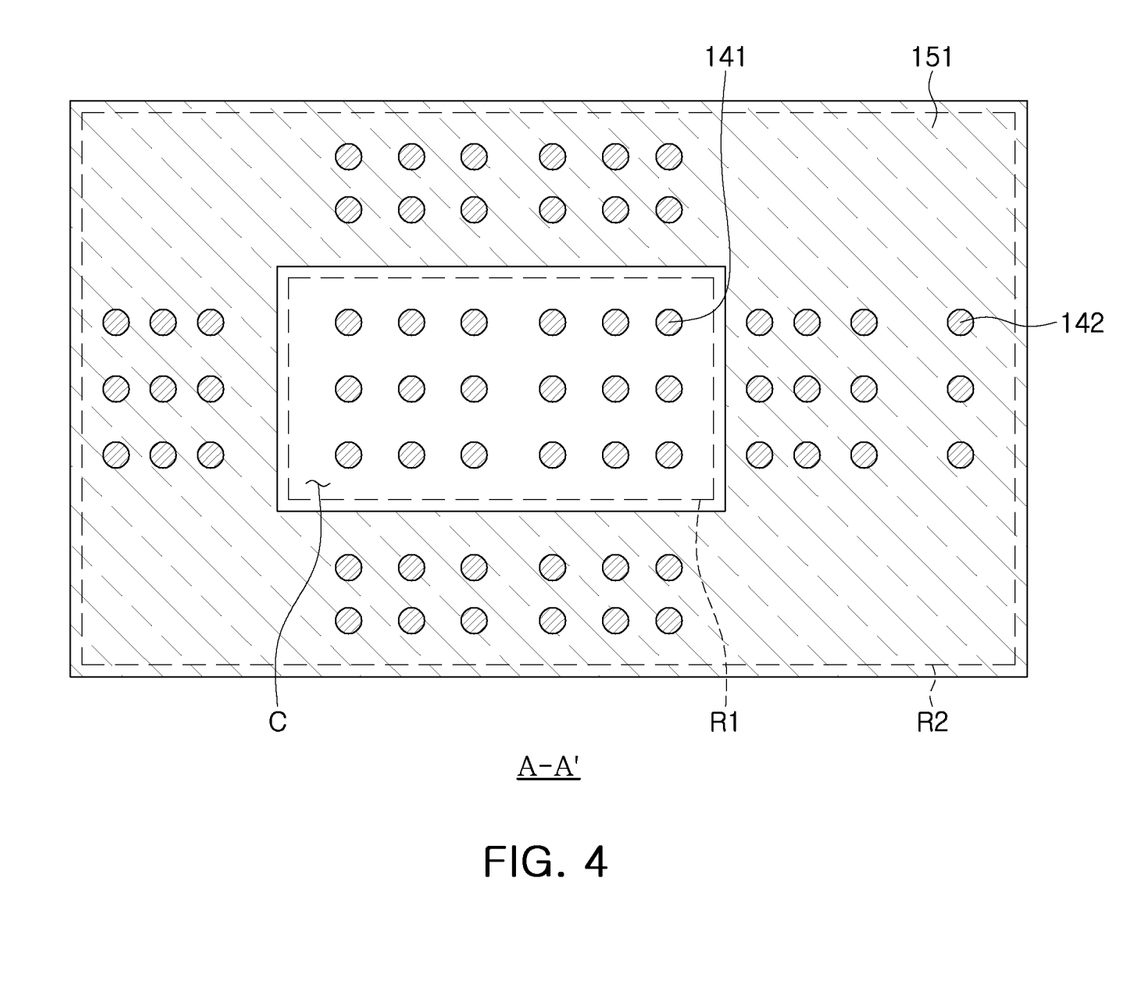
FIG. 4 is a cross-sectional diagram illustrating a planar structure taken along line A-A' in FIG. 3.

FIG. 4 is a cross-sectional diagram illustrating a planar structure taken along line A-A' in FIG. 3.

Referring to the drawing, a printed circuit board 100 according to an example embodiment may include a substrate 110 including a plurality of wiring layers 121a, 121b, 122, and 123, a first metal post 141 disposed on the substrate 110 and connected to at least a portion of an uppermost wiring layer 122 among the plurality of wiring layers 121a, 121b, 122, and 123, a second metal post 142 disposed on the substrate 110 and connected to at least another portion of the uppermost wiring layer 122 among the plurality of wiring layers 121a, 121b, 122, and 123, a first resist layer 151 disposed on the substrate 110 and embedding at least a portion of each of the first and second metal posts 141 and 142, and a metal via 143 penetrating through the first resist layer 151 on the second metal post 142 and connected to the second metal post 142.

As such, the printed circuit board 100 according to an example embodiment may include a first metal post 141 including a metal post for signal connection for mounting a semiconductor chip on the outermost side of the substrate 110, such that a semiconductor chip having a narrow bump pitch may be mounted thereon, and an excellent signal transmission rate may be obtained such as improved signal transmission properties. Also, the printed circuit board 100 according to an example embodiment may include a second metal post 142 including a metal post for a dummy on the outermost side of the board 110, such that an excellent heat dissipation effect may be obtained, and also an electromagnetic shielding effect may be obtained. Also, in the printed circuit board 100 according to an example embodiment, a metal via 143 penetrating the first resist layer 151 may be disposed on the second metal post 142, such that the above-described heat dissipation and electromagnetic wave shielding effects may further improve.

The printed circuit board 100 according to an example embodiment may further include a stiffener 160 disposed on the first resist layer 151. Through the stiffener 160, an effect of addressing warpage may be obtained. The stiffener 160 may be connected to the metal via 143, and when the stiffener 160 may include a metal material, an improved heat dissipation effect may be obtained.

The printed circuit board 100 according to an example embodiment may further include a second resist layer 152 disposed on a side opposite to the side on which the first resist layer 151 is disposed on the substrate 110. For example, the second resist layer 152 may be disposed on the lower side of the substrate 110 and may cover at least a portion of the wiring layer 123 disposed on the lowermost side of the plurality of wiring layers 121a, 121b, 122, and 123. Accordingly, the lower side of the substrate 110 may be protected.

Meanwhile, the first resist layer 151 may include a first region R1 embedding at least a portion of the first metal post 141 and a second region R2 embedding at least a portion of the second metal post 142. The first region R1 may be disposed on a central portion of the first resist layer 151 on a plane. The second region R2 may be disposed on an outer portion of the first resist layer 151 on a plane. For example, the second region R2 may surround the first region R1 on a plane. The first region R1 may be a component mounting region, and the second region R20 may be a dummy region. Through this arrangement, the above-described heat dissipation and electromagnetic wave shielding effects may further improve.

Meanwhile, the upper surface of the metal via 143 may be exposed from the upper surface of the first resist layer 151. More specifically, the upper surface of the metal via 143 may be exposed from the upper surface of the first resist layer 151 in the second region R2. The exposed upper surface of the metal via 143 and the upper surface of the first resist layer 151 in the second region R2 may be substantially coplanar with each other. In this case, the stiffener 160 may be directly formed on the coplanar surface more easily, and accordingly, the stiffener 160 may be in direct contact with the exposed upper surface of the metal via 143. In this case, the process may be further simplified, and yield may improve and costs may be reduced. Also, a more excellent heat dissipation effect may be obtained by shortening the heat dissipation path.

Meanwhile, a plurality of the first and second metal posts 141 and 142 and a plurality of the metal via 143 may be disposed. In this case, the first resist layer 151 may fill substantially overall spaces between the plurality of second metal posts 142 on a plane. Also, the first resist layer 151 may substantially fill overall spaces between the plurality of metal vias 143 on a plane. Accordingly, as in the process described later, structurally, the plurality of second metal posts 142 may be covered with the first resist layer 151, via holes may be processed in the first resist layer 151 and may be filled with plating, thereby forming the metal vias 143, and in this case, the metal via 143 may be formed easily in a relatively simple process, which may be advantageous.

Meanwhile, the first resist layer 151 may have a cavity C exposing a portion of the first metal post 141 in the first region R1, and a portion of the first metal post 141 may protrude to the upper surface of the first resist layer 151 by the cavity C. Also, the upper surface of the first resist layer 151 may have a step difference due to the cavity C. That is, the first resist layer 151 may have different thicknesses in the first and second regions R1 and R2. More specifically, the thickness in the first region R1 may be thinner than the thickness in the second region R2 due to the cavity C. The thickness may be measured using a scanning microscope or an optical microscope, such as, for example, an optical microscope (×1000) of Olympus, based on the polished or cross-section of the printed circuit board 100. When the thickness is not constant, the thickness may be an average value of the thicknesses measured at five random points. In this case, the semiconductor chip may be more stably mounted on the cavity C, and the thickness of the semiconductor package after the semiconductor chip is mounted may be reduced. Also, since only the first metal post 141 may selectively protrude, and the second metal post 142 may not protrude, other problems may be prevented from affecting the product.

Hereinafter, components of the printed circuit board 100 according to an example embodiment will be described in greater detail with reference to the drawings.

The substrate 110 may include a plurality of insulating layers 111, 112, and 113. The plurality of insulating layers 111, 112, and 113 may include the core insulating layer 111 and the plurality of build-up insulating layers 112 and 113 built up on both sides of the core insulating layer 111. For example, the substrate 110 may be a core-type substrate. However, an example embodiment thereof is not limited thereto, and the core insulating layer 111 may not be provided and the substrate 110 may be a coreless type substrate including at least one of the build-up insulating layers 112 and 113.

The core insulating layer 111 may include an insulating material. As an insulating material, a thermosetting resin such as an epoxy resin, a thermoplastic resin such as polyimide, or a material in which these resins are mixed with an inorganic filler such as silica, or a resin impregnated in a core material such as glass fiber (glass fiber, glass cloth, glass fabric) together with an inorganic filler, such as, for example, an Ajinomoto build-up film (ABF), prepreg, or the like, may be used, but an example embodiment thereof is not limited thereto. The core insulating layer 111 may have a thickness greater than that of each of the build-up insulating layers 112 and 113, but an example embodiment thereof is not limited thereto. The thickness may be measured using a scanning microscope or an optical microscope, such as, for example, an optical microscope (×1000) of Olympus, based on the polished or cross-section of the printed circuit board 100. When the thickness is not constant, the thickness may be an average value of the thicknesses measured at five random points.

The build-up insulating layers 112 and 113 may also include an insulating material. As an insulating material, a thermosetting resin such as an epoxy resin, a thermoplastic resin such as polyimide, or a material in which these resins are mixed with an inorganic filler such as silica, or a resin impregnated in a core material such as glass fiber together with an inorganic filler, such as, for example, an Ajinomoto build-up film (ABF), prepreg, or the like, may be used, but an example embodiment thereof is not limited thereto. The number of layers of the build-up insulating layers 112 and 113 is not limited to any particular example, and may have the same number of layers, but an example embodiment thereof is not limited thereto.

The substrate 110 may include a plurality of wiring layers 121*a*, 121*b*, 122, and 123. The plurality of wiring layers 121*a*, 121*b*, 122, and 123 may include core wiring layers 121*a* and 121*b* disposed on both surfaces of the core insulating layer 111, and a plurality of build-up wiring layers 122 and 123 disposed on or in the plurality of build-up insulating layers 112 and 113, respectively. In the case of a coreless substrate, the core wiring layers 121*a* and 121*b* together with the core insulating layer 111 may not be provided.

Each of the core wiring layers 121*a* and 121*b* may include a metal material. The metal material may include copper (Cu), aluminum (Al), silver (Ag), tin (Sn), gold (Au), nickel (Ni), lead (Pb), titanium (Ti), and/or alloys thereof. Each of the core wiring layers 121*a* and 121*b* may include an electroless plating layer (or chemical copper) and an electrolytic plating layer (or electrolytic copper), but an example embodiment thereof is not limited thereto. A sputter layer may be formed instead of chemical copper as the electroless plating layer. If desired, copper foil may be further included. Each of the core wiring layers 121*a* and 121*b* may perform various functions according to a design of the corresponding layer. For example, the core wiring layers 121*a* and 121*b* may include a ground pattern, a power pattern, and a signal pattern. Here, the signal pattern may include various signals other than a ground pattern and a power pattern, such as, for example, a data signal. Each of these patterns may include a line pattern, a plane pattern, and/or a pad pattern.

Each of the build-up wiring layers 122 and 123 may also include a metal material. The metal material may include copper (Cu), aluminum (Al), silver (Ag), tin (Sn), gold (Au), nickel (Ni), lead (Pb), titanium (Ti), and/or alloys thereof. The build-up wiring layers 122 and 123 may also include an electroless plating layer (or chemical copper) and an electrolytic plating layer (or electrolytic copper), respectively, but an example embodiment thereof is not limited thereto. A sputter layer may be formed instead of chemical copper as the electroless plating layer. If desired, copper foil may be further included. The build-up wiring layers 122 and 123 may also perform various functions according to a design of the respective layer. For example, the build-up wiring layers 122 and 123 may include a ground pattern, a power pattern, and a signal pattern. Here, the signal pattern may include various signals other than a ground pattern and a power pattern, such as, for example, a data signal. Each of these patterns may include a line pattern, a plane pattern, and/or a pad pattern.

The substrate 110 may include a plurality of via layers 131, 132, and 133. The plurality of via layers 131, 132, and 133 may include a core via layer 131 penetrating the core insulating layer 111 and a plurality of build-up via layers 132 and 133 penetrating the plurality of build-up insulating layers 112 and 113, respectively. The core via layer 131 may electrically connect the core wiring layers 121a and 121b to each other. The build-up via layers 132 and 133 may electrically connect the build-up wiring layers 122 and 123 to each other, and may also electrically connect the core wiring layers 121a and 121b and the build-up wiring layers 122 and 123 to each other. In the case of a coreless substrate, the core via layer 131 together with the core insulating layer 111 may not be provided.

The core via layer 131 may include a through-via. The through-via may include a metal layer formed on a wall surface of the through-hole and a plug embedding the metal layer. The metal layer may include copper (Cu), aluminum (Al), silver (Ag), tin (Sn), gold (Au), nickel (Ni), lead (Pb), titanium (Ti), and/or alloys thereof. The plug may include ink formed of an insulating material. The metal layer may include an electroless plating layer (or chemical copper) and an electrolytic plating layer (or electrolytic copper), but an example embodiment thereof is not limited thereto. A sputter layer may be formed instead of chemical copper as the electroless plating layer. The core via layer 131 may perform various functions according to a design. For example, the core via layer 131 may include a ground via, a power via, a signal via, and the like. Here, the signal via may include a via for transferring various signals other than a ground via and a power via, such as, for example, data signals.

The build-up via layers 132 and 133 may include microvias. The microvias may be field vias filling the via holes or conformal vias arranged along the walls of the via holes. The micro-vias may be arranged in a stacked type and/or a staggered type. Each of the build-up via layers 132 and 133 may include a metal material, and the metal material may include copper (Cu), aluminum (Al), silver (Ag), tin (Sn), gold (Au), nickel (Ni), lead (Pb), titanium (Ti), and/or alloys thereof. The build-up via layers 132 and 133 may include an electroless plating layer (or chemical copper) and an electrolytic plating layer (or electrolytic copper), respectively, but an example embodiment thereof is not limited thereto. A sputter layer may be formed instead of chemical copper as the electroless plating layer. The build-up via layers 132 and 133 may perform various functions according to a design of the corresponding layer. For example, the build-up via layers 132 and 133 may include ground vias, power vias, signal vias, and the like. Here, the signal vias may include vias for transferring various signals other than ground vias and power vias, such as, data signals.

The metal posts 141 and 142 may have a high aspect ratio of 1 or more. The metal posts 141 and 142 may include copper (Cu), aluminum (Al), silver (Ag), tin (Sn), gold (Au), nickel (Ni), lead (Pb), titanium (Ti), and/or alloys thereof. The metal posts 141 and 142 may be formed through a plating process and may include an electrolytic plating layer (or electrolytic copper), but an example embodiment thereof is not limited thereto.

The first metal post 141 may perform various functions such as a signal post, a ground post, and a power post, and may include at least a signal post. The second metal post 142 may be a post for dummy, and the post for dummy may function as a post for ground and/or a post for power if desired, and may be electrically isolated from the signal post at least within the substrate 110. The first and second metal posts 141 and 142 may have substantially the same thickness. The thickness may be measured using a scanning microscope or an optical microscope, such as, for example, an optical microscope (×1000) of Olympus, based on the polished or cross-section of the printed circuit board 100. When the thickness is not constant, the thickness may be an average value of the thicknesses measured at five random points.

The metal via 143 may include a metal material, and the metal material may include copper (Cu), aluminum (Al), silver (Ag), tin (Sn), gold (Au), nickel (Ni), lead (Pb), titanium (Ti), and/or alloys thereof. The metal via 143 may include an electrolytic plating layer (or electrolytic copper), but an example embodiment thereof is not limited thereto. The metal vias 143 may be dummy vias, and the dummy vias may function as ground vias and/or power vias if desired, but the metal vias 143 may be electrically insulated from signal vias at least within the substrate 110.

The resist layers 151 and 152 may include an insulating material, and a liquid type or film type solder resist may be used as the insulating material. However, an example embodiment thereof is not limited thereto, and other types of materials may be used. The first resist layer 151 may include a plurality of layers, and the plurality of layers may have distinct boundaries therebetween or may be integrated with each other with indistinct boundaries.

The stiffener 160 may include a material having high stiffness, such as, for example, a material having high modulus. The material of the stiffener 160 is not limited to any particular example, and metal materials such as iron (Fe), copper (Cu), copper alloys, and stainless steel, or insulating materials including other reinforcing materials may be used, but an example embodiment thereof is not limited thereto not.

Figure 5:
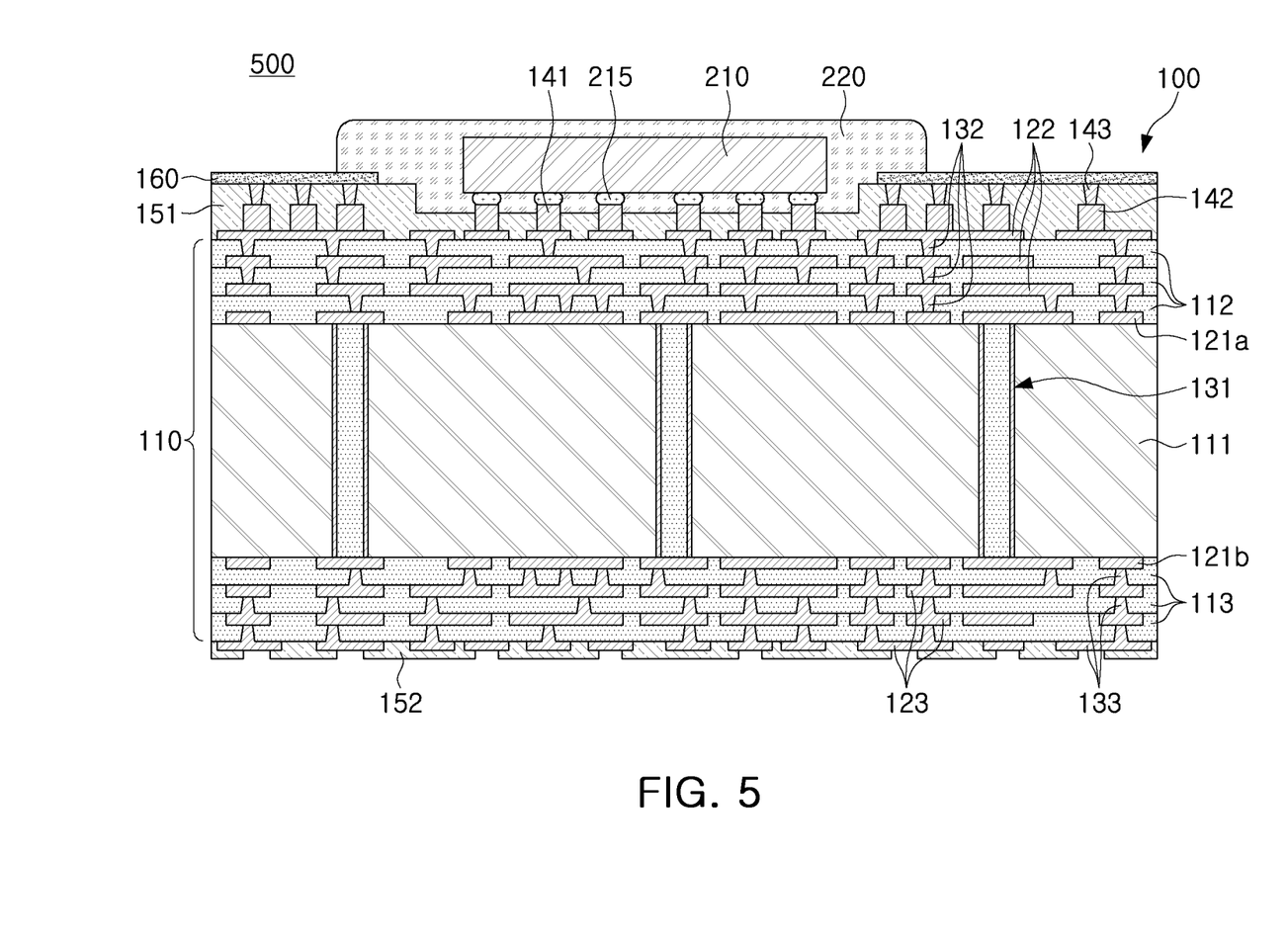
FIG. 5 is a cross-sectional diagram illustrating a modified example of the printed circuit board illustrated in FIG. 3.

FIG. 5 is a cross-sectional diagram illustrating a modified example of the printed circuit board illustrated in FIG. 3.

Referring to the drawings, a printed circuit board 500 according to a modified example may include the above-described printed circuit board 100 and a semiconductor chip 210 mounted on the printed circuit board 100. The semiconductor chip 210 may be disposed on the first resist 151, more specifically, on the cavity C of the first resist layer 151, and may be electrically connected to the first metal post 141 through solder 215. If desired, a molding material 220 for molding at least a portion of the semiconductor chip 210 may be further disposed on the first resist layer 151. The molding material 220 may fill at least a portion of the cavity C. If desired, other electronic components may be disposed in addition to the semiconductor chip 210.

The semiconductor chip 210 may include an integrated circuit (IC) die in which hundreds to millions of elements or more are integrated into a single chip. In this case, the integrated circuit may be implemented as a logic chip, such as, for example, a central processor (e.g., CPU), a graphics processor (e.g., GPU), a field programmable gate array (FPGA), a digital signal processor, a cryptographic processor, a microprocessor, a microcontroller, an application processor (e.g., AP), an analog-to-digital converter, and an application-specific IC (ASIC), but an example embodiment thereof is not limited thereto, and the semiconductor chip 210 may be a memory chip such as volatile memory (e.g., DRAM), non-volatile memory (e.g., ROM), flash memory, high bandwidth memory (HBM), or other types such as a power management IC (PMIC).

The semiconductor chip 210 may be formed based on an active wafer, and in this case, silicon (Si), germanium (Ge), or gallium arsenide (GaAs) may be used as a base material included in each body. Various circuits may be formed in the body. A connection pad may be formed on each body, and the connection pad may include a conductive material such as aluminum (Al) or copper (Cu). The semiconductor chip 210 may be a bare die, and in this case, metal bumps may be disposed on connection pads. The semiconductor chip 210 may be a packaged die. In this case, a redistribution layer may be further formed on the connection pad, and metal bumps may be disposed on the redistribution layer.

A plurality of semiconductor chips 210 may be disposed, and the plurality of semiconductor chips 210 may be of the same type or different types. The plurality of semiconductor chips 210 may be electrically connected to each other through the printed circuit board 100.

The solder 215 may allow the semiconductor chip 210 to be mounted on the printed circuit board 100. The solder 215 may be formed of a low melting point metal such as tin (Sn)-aluminum (Al)-copper (Cu), and may be a bump or ball type. However, an example embodiment thereof is not limited thereto, and the semiconductor chip 210 may not be necessarily mounted through the solder 215.

The molding material 350 may protect the semiconductor chip 210. The material of the molding material 350 is not limited to any particular example, and a known molding material such as an epoxy molding compound (EMC) may be used.

Also, the other descriptions, such as the descriptions described with respect to the printed circuit board 100 according to the example embodiment may also be applied to the printed circuit board 500 according to the modified example, and accordingly, overlapping descriptions will not be provided.

FIGS. 6 to 10 are process diagrams illustrating an example embodiment of manufacturing the printed circuit board in FIG. 3 and the printed circuit board in FIG. 5.

Figure 6:
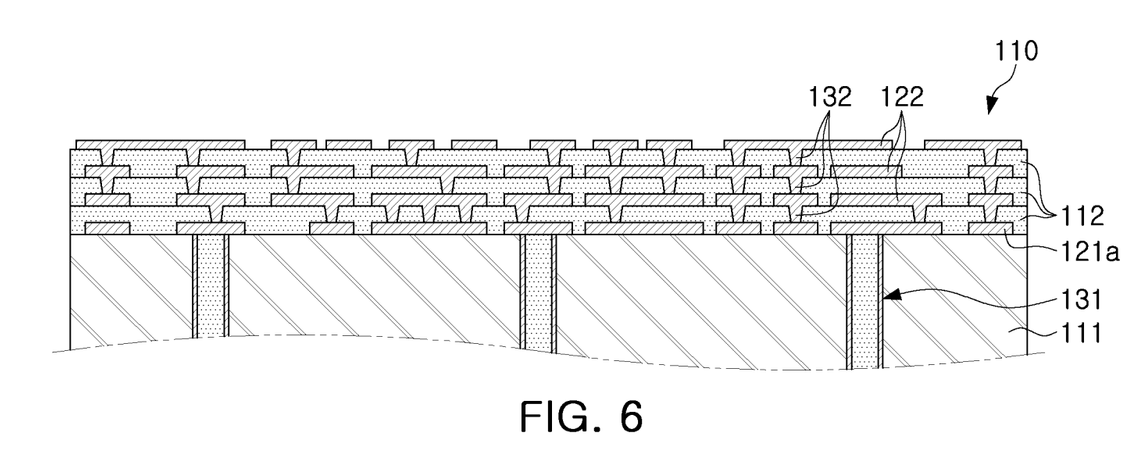
FIGS. 6 to 10 are process diagrams illustrating an example embodiment of manufacturing the printed circuit board in FIG. 3 and the printed circuit board in FIG. 5.

Referring to FIG. 6, a substrate 110 may be prepared. The substrate 110 may be formed by repeating the processes of, for example, forming vias and wiring on CCL, building ABF or PPG on both sides of CCL, and forming vias and wiring on the built-up ABF or PPG, respectively. Alternatively, the substrate 110 may be formed by a coreless process using a detach carrier. However, an example embodiment thereof is not limited thereto, and the substrate 110 may be formed by other PCB processes.

Figure 7:
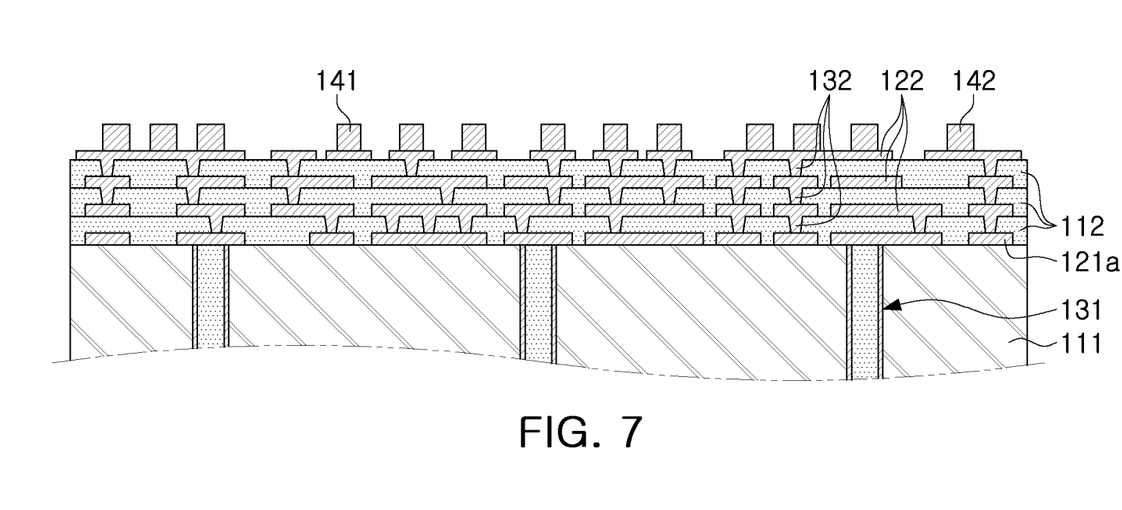

Referring to FIG. 7, first and second metal posts 141 and 142 may be formed on the wiring layer 122 disposed on the outermost side of the substrate 110. The first and second metal posts 141 and 42 may be formed by, for example, laminating a plating resist on the outermost wiring layer 122, forming an opening by patterning the plating resist, filling the opening of the plating resist by plating, and separating the plating resist, but an example embodiment thereof is not limited thereto. As described above, the first metal post 141 may be formed in the bump area in which the semiconductor chip is mounted, also the second metal post 142 may be simultaneously formed in the dummy area, and the second metal post 142 may remain without being removed, such that the process may be further simplified.

Figure 8:
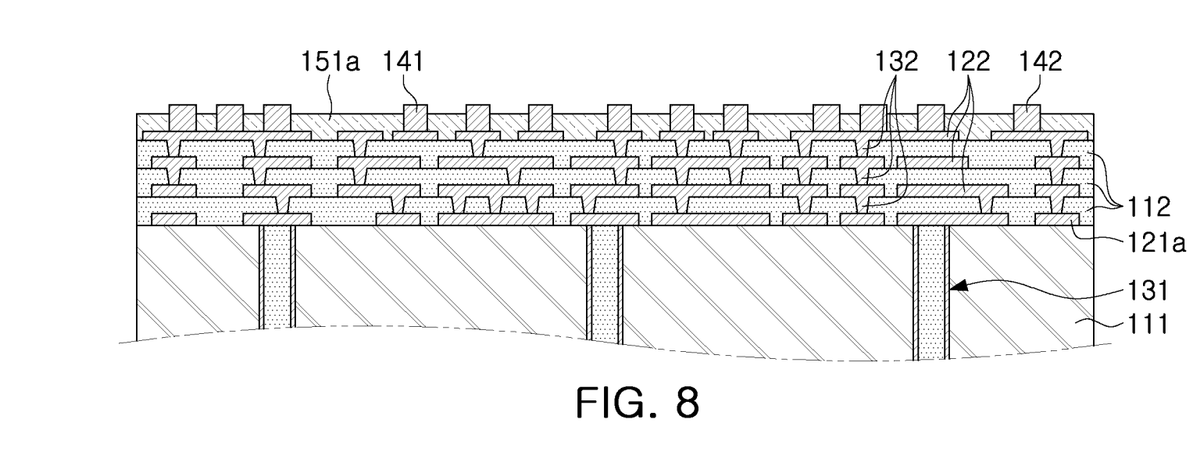

Referring to FIG. 8, a 1-1 resist layer 151a may be formed on the substrate 110. The 1-1 resist layer 151a may be formed by applying a liquid type solder resist. The 1-1 resist layer 151a may be formed to have a thickness smaller than the thickness of the first and second metal posts 141 and 142. Accordingly, a portion of each of the first and second metal posts 141 and 142 may protrude to the upper surface of the 1-1 resist layer 151a. The thickness may be measured using a scanning microscope or an optical microscope, for example, an optical microscope (×1000) of Olympus, based on the polished or cross-section of the printed circuit board 100. When the thickness is not constant, the thickness may be an average value of the thickness measured at five random points.

Figure 9:
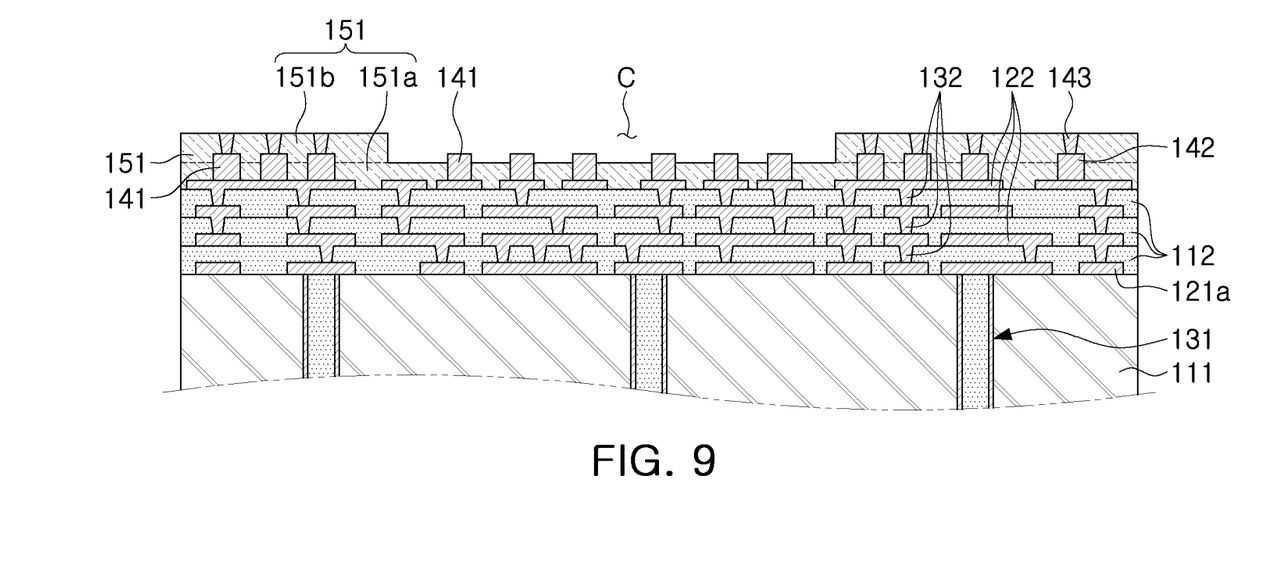

Referring to FIG. 9, a 1-2 resist layer 151b may be formed on a region covering the second metal posts 142 of the 1-1 resist layer 151a. The 1-2 resist layer 151b may also be formed by applying a liquid type solder resist. In one example, because the 1-1 resist layer 151a and the 1-2 resist layer 151b may be formed separately in different process steps or the 1-1 resist layer 151a and the 1-2 resist layer 151b may contain different materials, an interface or a boundary (presented by a dash line crossing the first resist layer 151 in FIG. 9) may exist between the 1-1 resist layer 151a and the 1-2 resist layer 151b. In this case, the interface may be disposed on a level that is between an upper surface and a lower surface of the second metal post 142. Thereafter, metal vias 143 may be formed in the 1-2 resist layer 151b. The metal via 143 may be formed by forming a via hole penetrating the 1-2 resist layer 151b and filling the via hole with plating. The 1-2 resist layer 151b may not be formed on the region of the 1-1 resist layer 151a covering the first metal posts 141, and accordingly, the cavity C may be formed in the first resist layer 151.

Figure 10:
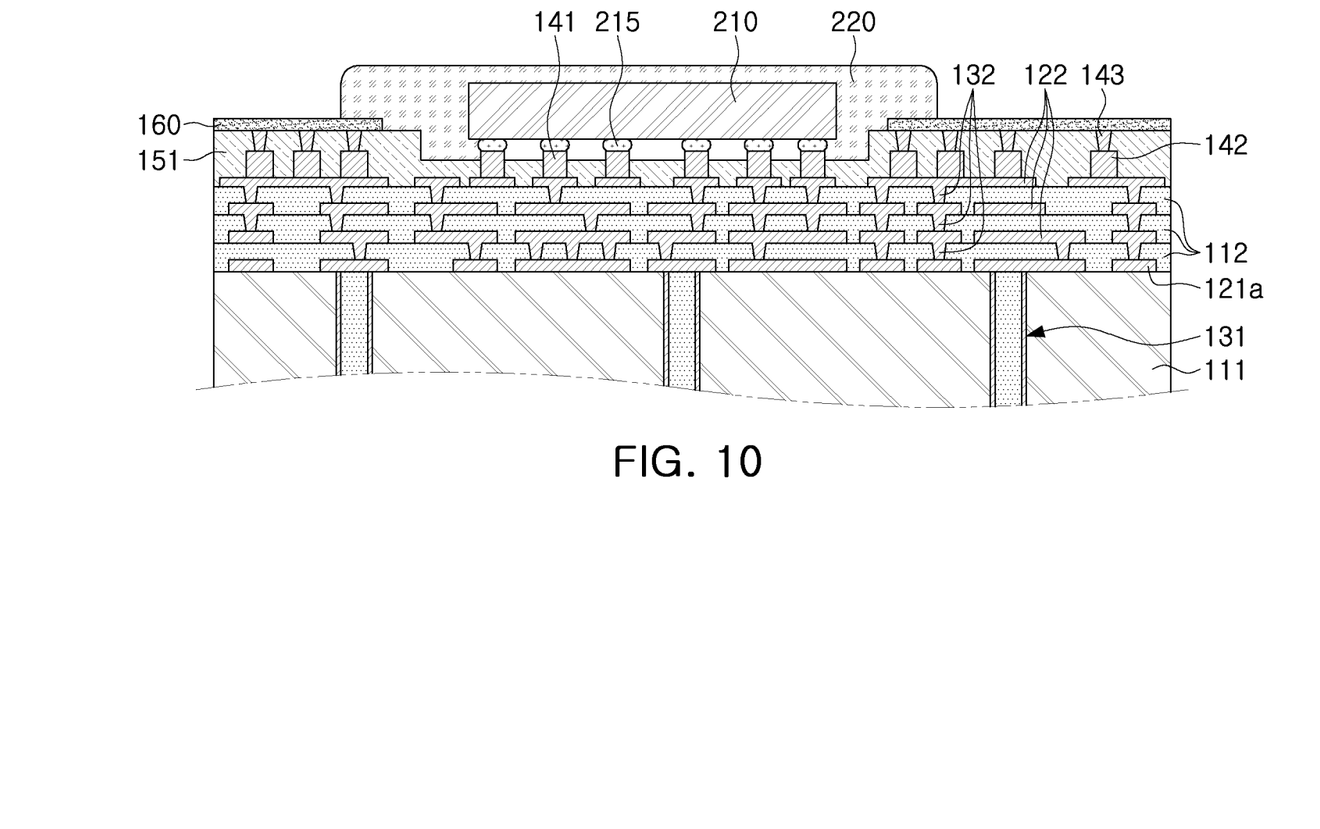

Referring to FIG. 10, a stiffener 160 may be formed on the first resist layer 151 and the metal via 143. The stiffener 160 may be formed by various methods such as plating, deposition, and coating. Also, the semiconductor chip 210 may be mounted using solder 215. Thereafter, the semiconductor chip 210 may be molded with the molding material 220 if desired.

Although the above-described printed circuit boards 100 and 500 may be manufactured through the series of processes, the above-described printed circuit boards 100 and 500 may be manufactured through other processes or modified processes.

The other descriptions, such as, for example, the overlapping other descriptions of the printed circuit board 100 according to the example embodiment and the printed circuit board 500 according to the modified example will not be provided.

According to the aforementioned example embodiments, a printed circuit board having excellent signal properties and excellent heat dissipation effect may be provided.

In the example embodiments, the cross-section may refer to a cross-sectional shape when an object is vertically cut, or a cross-sectional shape when the object is viewed from the side. Also, a plane may refer to a planar shape when the object is horizontally cut, or a planar shape when the object is viewed from the top or the bottom.

In the present disclosure, the example embodiments may include process errors, positional deviations, and measurement errors occurring in the process. For example, the configuration in which components are substantially the same may include the example in which the components are completely the same, and also the example in which a slight difference due to a process error may be present. Also, the configuration in which elements are substantially constant may include the example in which the elements are completely constant, and also the example in which a minute difference may be generated due to a process error. The configuration in which an element substantially fills or is disposed in another element may include the example in which the element completely fills or is disposed in the another element, and also the example in which a minute difference may be generated due to a process error. The configuration in which an element is substantially coplanar with another element may include the example in which the element is exactly coplanar with the another element, and also the example in which a minute difference may be generated due to a process error.

In the example embodiments, the term "connected" may not only refer to "directly connected" but also include "indirectly connected" by may refer to of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in an example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present invention as defined by the appended claims.

What is claimed is:

1. A printed circuit board, comprising:
    a substrate including a plurality of wiring layers disposed on or in a plurality of build-up insulating layers;
    a first metal post disposed on the substrate and connected to at least a portion of an uppermost wiring layer among the plurality of wiring layers;
    a second metal post disposed on the substrate and connected to at least another portion of the uppermost wiring layer among the plurality of wiring layers;
    a resist layer disposed on the substrate and embedding at least a portion of each of the first and second metal posts; and
    a metal via penetrating through the resist layer on the second metal post and connected to the second metal post,
    wherein a material of the resist layer is different from that of the plurality of the build-up insulating layers.

2. The printed circuit board of claim 1, wherein an upper surface of the metal via is exposed from an upper surface of the resist layer.

3. The printed circuit board of claim 2, wherein the exposed upper surface of the metal via and an upper surface of a region embedding at least a portion of the second metal post of the resist layer are substantially coplanar with each other.

4. The printed circuit board of claim 2,
    wherein a plurality of the first and second metal posts and a plurality of the metal vias are disposed, and
    wherein the resist layer substantially disposed in regions between the plurality of second metal posts and between the plurality of metal vias on a plane.

5. The printed circuit board of claim 2, further comprising:
    a stiffener disposed on the resist layer,
    wherein the stiffener is in direct contact with the exposed upper surface of the metal via.

6. The printed circuit board of claim 1, wherein the resist layer has a cavity, and a portion of the first metal post protrudes to an upper surface of the resist layer by the cavity.

7. The printed circuit board of claim 6, wherein the upper surface of the resist layer and an upper surface of the first metal post have a step difference in the cavity.

8. The printed circuit board of claim 1,
    wherein the resist layer has a first region embedding at least a portion of the first metal post and a second region embedding at least a portion of the second metal post,
    wherein the first region is disposed in a central portion of the resist layer on a plane, and
    wherein the second region is disposed on an outer portion of the resist layer on the plane.

9. The printed circuit board of claim 1,
    wherein the first metal post includes a metal post for signal connection, and
    wherein the second metal post comprises a dummy metal post.

10. The printed circuit board of claim 1, wherein the first and second metal posts are electrically insulated from each other in the substrate.

11. The printed circuit board of claim 1, wherein the first and second metal posts have substantially the same thickness.

12. The printed circuit board of claim 1,
    wherein the substrate includes a core insulating layer and the plurality of build-up insulating layers built up on both surfaces of the core insulating layer, and
    wherein the core insulating layer has a thickness greater than a thickness of each of the build-up insulating layers.

13. The printed circuit board of claim 1, wherein the first and second metal posts have an aspect ratio of at least 1 and substantially vertical side-walls.

14. The printed circuit board of claim 1, wherein the resist layer does not have a wiring layer disposed thereon.

15. The printed circuit board of claim 1, wherein the resist layer is disposed above an uppermost wiring layer among the plurality of wiring layers.

16. A printed circuit board, comprising:
a substrate including a plurality of wiring layers;
a first metal post disposed on the substrate and connected to at least a portion of an uppermost wiring layer among the plurality of wiring layers;
a second metal post disposed on the substrate and connected to at least another portion of the uppermost wiring layer among the plurality of wiring layers; and
a resist layer having a first region embedding at least a portion of the first metal post and a second region embedding at least a portion of the second metal post,
wherein the resist layer is disposed above an uppermost wiring layer among the plurality of wiring layers,
wherein the first region is disposed in a central portion of the resist layer on a plane,
wherein the second region is disposed on an outer portion of the resist layer on the plane, and
wherein the resist layer has different thicknesses in the first and second regions.

17. The printed circuit board of claim 16,
wherein the resist layer has a cavity exposing at least another portion of the first metal post in the first region so that the resist layer has a smaller thickness in the first region than a thickness in the second region.

18. The printed circuit board of claim 17, further comprising:
a semiconductor chip disposed on the cavity and connected to the first metal post.

19. The printed circuit board of claim 18, further comprising:
a molding material disposed on the resist layer, disposed in at least a portion of the cavity, and molding at least a portion of the semiconductor chip.

20. The printed circuit board of claim 16, wherein the first and second metal posts have an aspect ratio of at least 1 and substantially vertical side-walls.

21. The printed circuit board of claim 16, wherein the resist layer does not have a wiring layer disposed thereon.

22. A printed circuit board, comprising:
a substrate including a plurality of wiring layers;
a first metal post disposed on the substrate and connected to at least a portion of an uppermost wiring layer among the plurality of wiring layers;
a second metal post disposed on the substrate and connected to at least another portion of the uppermost wiring layer among the plurality of wiring layers; and
a resist layer disposed on the substrate, and including a first layer embedding at least a portion of each of the first and second metal posts and a second layer disposed on the first layer to cover another portion of the second metal post which protrudes from the first layer,
wherein the second layer is spaced apart from the first metal post, and
wherein the first and second metal posts have an aspect ratio of at least 1 and substantially vertical side-walls.

23. The printed circuit board of claim 22, wherein the first metal post protrudes from the first layer.

24. The printed circuit board of claim 22, further comprising:
a stiffener disposed on the second layer and spaced apart from the first layer.

25. The printed circuit board of claim 22, wherein an interface between the first layer and the second layer is disposed on a level between an upper surface of the second metal post and a lower surface of the second metal post.

26. The printed circuit board of claim 22,
wherein the first metal post includes a metal post for signal connection, and
wherein the second metal post includes a dummy metal post electrically insulated from the first metal post in the substrate.

27. The printed circuit board of claim 22, wherein the resist layer is disposed above an uppermost wiring layer among the plurality of wiring layers.

* * * * *